United States Patent
Lee et al.

(10) Patent No.: US 12,334,180 B2
(45) Date of Patent: Jun. 17, 2025

(54) MEMORY MODULE AND MEMORY SYSTEM HAVING THE SAME

(71) Applicant: Samsung Electronics Co., Ltd., Suwon-si (KR)

(72) Inventors: Kyudong Lee, Seoul (KR); Young Yun, Yongin-si (KR); Sungjoo Park, Anyang-si (KR); Jinseong Yun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 454 days.

(21) Appl. No.: 17/938,780

(22) Filed: Oct. 7, 2022

(65) Prior Publication Data

US 2023/0035640 A1 Feb. 2, 2023

Related U.S. Application Data

(63) Continuation of application No. 16/709,984, filed on Dec. 11, 2019, now abandoned.

(30) Foreign Application Priority Data

Apr. 24, 2019 (KR) .................. 10-2019-0047980
Jul. 26, 2019 (KR) .................. 10-2019-0090970

(51) Int. Cl.
*G11C 5/14* (2006.01)

(52) U.S. Cl.
CPC .................. *G11C 5/147* (2013.01)

(58) Field of Classification Search
CPC .......... G11C 5/147; G11C 7/222; G11C 5/04; Y02D 10/00; G06F 13/1668; G06F 1/04; G06F 1/26
See application file for complete search history.

(56) References Cited

U.S. PATENT DOCUMENTS

| 3,513,400 A | 5/1970 | Russell |
| 7,876,592 B2 | 1/2011 | Berke |

(Continued)

FOREIGN PATENT DOCUMENTS

| CN | 109427373 A | 3/2019 |
| CN | 109671464 A | 4/2019 |

(Continued)

OTHER PUBLICATIONS

"DDR4 SDRAM Registered DIMM Design Specification, JEDEC Standard No. 21C, Revision 1.00 (Sep. 2014)".

*Primary Examiner* — Jaweed A Abbaszadeh
*Assistant Examiner* — Brynne J. Corcoran
(74) *Attorney, Agent, or Firm* — Myers Bigel, P.A.

(57) ABSTRACT

A memory module includes a serial presence detector (SPD) configured to detect a module identification (ID) through at least one module position identification terminal, and generate at least one of the module ID and a register address corresponding to the module ID. A power management unit (PMU) is responsive to at least one of the module ID and the register address generated by the SPD. The PMU is configured to set an on-time point and/or an off-time point of an internal clock signal based on at least one of the module ID and the register address corresponding to the module ID, and further configured to generate at least one internal power supply voltage in response to the internal clock signal. A plurality of memory devices are also provided, which are configured to receive the at least one internal power supply voltage and perform an operation in response to command/address signals.

20 Claims, 11 Drawing Sheets

(56) References Cited

U.S. PATENT DOCUMENTS

| | | | |
|---|---|---|---|
| 7,921,256 B2 | 4/2011 | Im | |
| 8,055,922 B2 | 11/2011 | Brittain et al. | |
| 8,930,740 B2 | 1/2015 | Zerbe et al. | |
| 9,627,028 B2 | 4/2017 | Mera et al. | |
| 9,703,354 B2 | 7/2017 | Lee et al. | |
| 2002/0060948 A1* | 5/2002 | Chang | G11C 7/225 365/233.1 |
| 2005/0138267 A1 | 6/2005 | Bains et al. | |
| 2006/0009933 A1* | 1/2006 | Sutardja | H03H 7/40 702/65 |
| 2008/0259553 A1* | 10/2008 | Hsu | G06F 1/26 361/736 |
| 2009/0015227 A1 | 1/2009 | Wong et al. | |
| 2009/0200995 A1 | 8/2009 | Tran et al. | |
| 2010/0064099 A1 | 3/2010 | Nishtala et al. | |
| 2010/0138684 A1 | 6/2010 | Kim et al. | |
| 2014/0219044 A1 | 8/2014 | Shin et al. | |
| 2015/0228358 A1 | 8/2015 | Agata et al. | |
| 2018/0059933 A1 | 3/2018 | Helmick et al. | |
| 2018/0260345 A1 | 9/2018 | Jung | |
| 2019/0065074 A1 | 2/2019 | Lee et al. | |
| 2019/0103801 A1 | 4/2019 | Venkataraman et al. | |
| 2019/0115053 A1 | 4/2019 | Park et al. | |
| 2019/0188165 A1 | 6/2019 | Venkatraman et al. | |
| 2021/0004336 A1* | 1/2021 | Liu | G06F 9/4403 |

FOREIGN PATENT DOCUMENTS

| | | |
|---|---|---|
| CN | 107785044 B | 5/2021 |
| JP | 5915764 B2 | 4/2016 |
| KR | 100842403 B1 | 6/2008 |
| KR | 101654487 B1 | 9/2016 |
| KR | 20180102268 A | 9/2018 |

\* cited by examiner

| MODULE ID | 000 | 001 | 010 | 011 | 100 | 101 | 110 | 111 |
|---|---|---|---|---|---|---|---|---|
| CONTROL DATA | C1 | C2 | C3 | C4 | C5 | C6 | C7 | C8 |

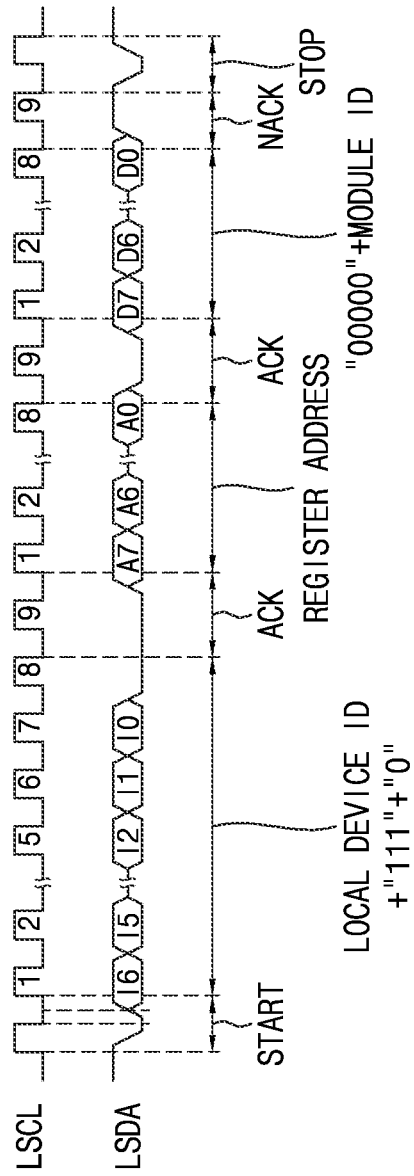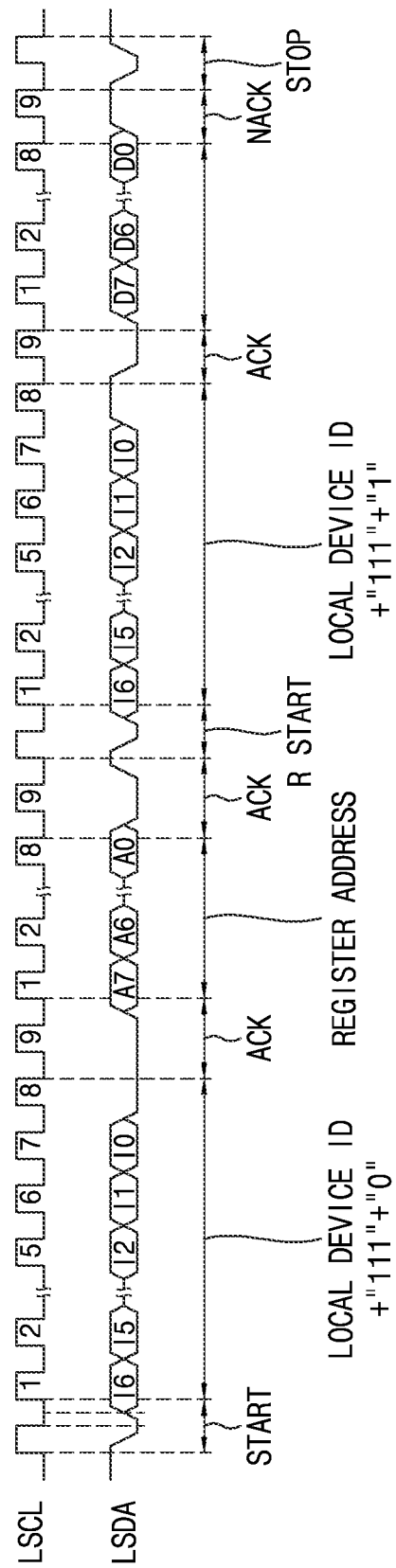

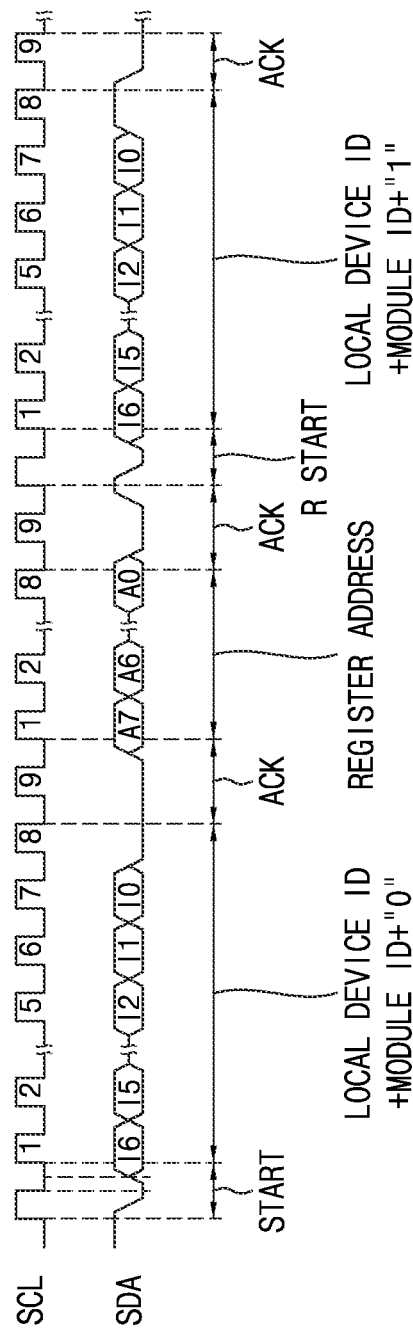
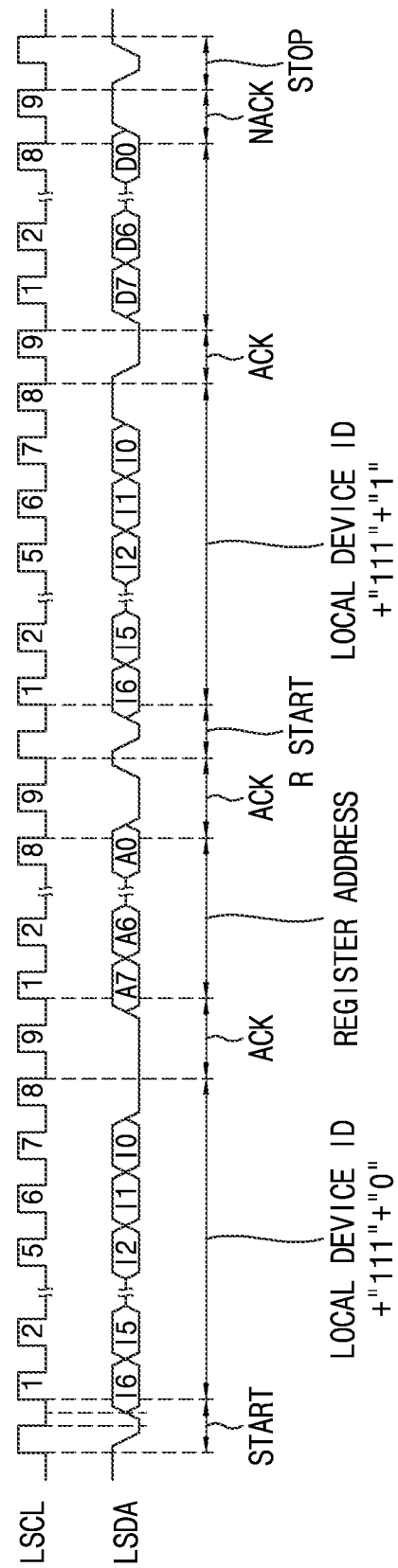

MEMORY MODULE AND MEMORY SYSTEM HAVING THE SAME

REFERENCE TO PRIORITY APPLICATION

This application is a continuation of U.S. patent application Ser. No. 16/709,984, filed Dec. 11, 2019, which claims priority from Korean Patent Application No. 10-2019-0047980, filed Apr. 24, 2019, and Korean Patent Application No. 10-2019-0090970, filed Jul. 26, 2019, the disclosures of which are hereby incorporated herein by reference.

BACKGROUND

1. Field

Devices and systems consistent with example embodiments relate to a memory module and a memory system including the same.

2. Description of Related Art

A memory system may generally include a plurality of memory slots, a controller, and a power management unit (PMU), which are mounted on a main board. A memory module may be inserted into each of the plurality of memory slots. However, recently, the memory module including the power management unit has been developed. Accordingly, there is a need for a technology of controlling the power management unit included in each of the plurality of memory modules to stably generate internal power supply voltages using an external power supply voltage.

SUMMARY

The example embodiments of the inventive concept are directed to providing a memory module capable of stably generating internal power supply voltages by a power management unit (PMU) included in a memory module, and a memory system having the same.

Aspects of the inventive concept should not be limited by the above description, and other unmentioned aspects will be clearly understood by one of ordinary skill in the art from example embodiments described herein.

According to example embodiments, there is provided a memory module, which includes a serial presence detector configured to detect a module identification (ID) through at least one module position identification terminal, and transmit the module ID (or a register address corresponding to the module ID). A power management unit is also provided, which is configured to: communicate with the serial presence detector over a local data communication channel, receive the module ID (or the register address corresponding to the module ID), set an on-time point and/or an off-time point of an internal clock signal based on the module ID (or the register address corresponding to the module ID), and generate at least one internal power supply voltage in response to the internal clock signal. A plurality of semiconductor memory devices are also provided, which are configured to receive the at least one internal power supply voltage, perform an operation in response to command/address signals, and store or output data.

According to additional embodiments, there is provided a memory module, which includes a power management unit configured to set an on-time point and/or an off-time point of an internal clock signal based on a module ID, and generate at least on internal power supply voltage in response to the internal clock signal. A plurality of semiconductor memory devices are also provided, which are configured to receive the at least one internal power supply voltage, perform an operation in response to command/address signals, and store or output data.

According to further embodiments of the invention, there is provided a memory system including: a main board, a plurality of memory slots disposed at a plurality of positions different from each other on the main board, a plurality of memory modules mounted in the plurality of memory slots, and a control unit. This control unit is configured to perform global data communication with the plurality of memory modules, transmit a command/address, and transmit and receive data. Each of the plurality of memory modules may include a respective power management unit, which is configured to set an on-time point and/or an off-time point of an internal clock signal based on a corresponding module ID among a plurality of different module IDs, and generate at least one internal power supply voltage in response to the internal clock signal. A plurality of semiconductor memory devices are also provided, which are configured to receive the at least one internal power supply voltage, perform an operation in response to the command/address, and store or output the data.

BRIEF DESCRIPTION OF THE DRAWINGS

FIG. 8 is an operational timing diagram for describing local data communication between a serial presence detector and a power management unit according to an example embodiment of the inventive concept.

FIG. 9 is an operational timing diagram for describing local data communication between a serial presence detector and a power management unit according to an example embodiment of the inventive concept.

FIG. 10 is an operational timing diagram for describing global data communication between an external device and a serial presence detector according to an example embodiment of the inventive concept.

FIG. 11 is an operational timing diagram for describing local data communication between a serial presence detector and a power management unit according to an example embodiment of the inventive concept.

DETAILED DESCRIPTION OF EXEMPLARY EMBODIMENTS

Hereinafter, a memory module and a memory system having the same according to example embodiments will be described with reference to the accompanying drawings.

Figure 1:
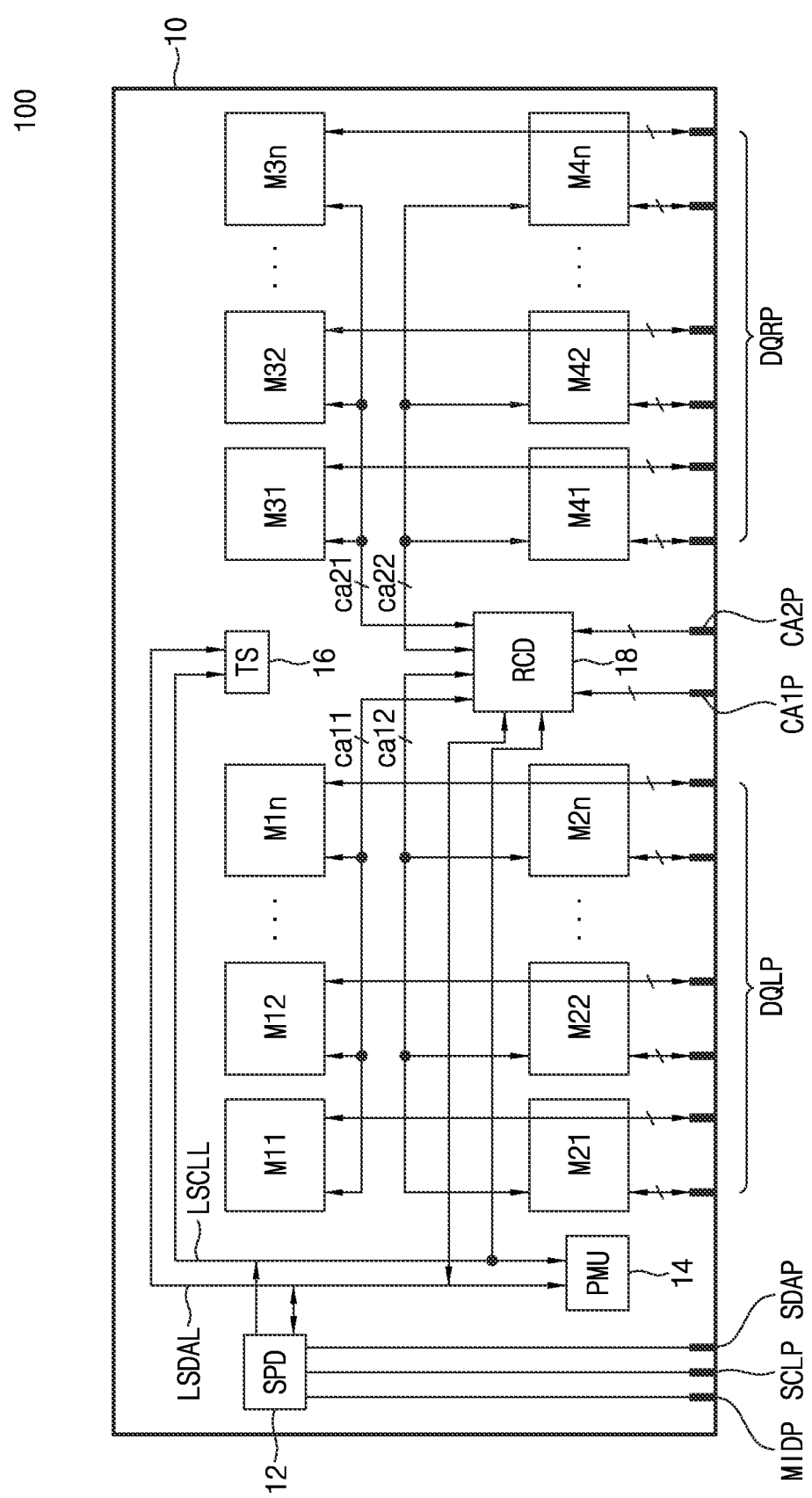
FIG. 1 is a block diagram of a configuration of a memory module according to an example embodiment of the inventive concept.

FIG. 1 is a block diagram illustrating a configuration of a memory module according to an example embodiment of the inventive concept, a memory module 100 may include 4n semiconductor memory devices M11 to M1n, M21 to M2N, M31 to M3n, and M41 to M4n, a module board 10, a serial presence detector (SPD) 12, a power management unit (PMU) 14, a temperature sensor (TS) 16, and a register clock driver (RCD) 18. In FIG. 1, the 4n semiconductor memory devices M11 to M1n, M21 to M2N, M31 to M3n, and M41 to M4n, the serial presence detector 12, a power management unit 14, a temperature sensor 16, and a register clock driver 18 may be mounted on an upper surface (or a lower surface) of the main board 10. DQLP may represent left data terminals, DQRP may represent right data terminals, CA1P may represent first command/address terminals, CA2P may represent second command/address terminals, SAP may represent serial address terminals, SCLP may represent a serial clock signal terminal, and SDAP may represent serial data terminals.

A function of each of the blocks shown in FIG. 1 is described more fully hereinbelow.

Then semiconductor memory devices M11 to M1n may input and output data through some terminals of the left data terminals DQLP in response to a first command/address signal ca11, and then semiconductor memory devices M21 to M2n may input and output data through the remaining terminals of the left data terminals DQLP in response to a second command/address signal ca12. The n semiconductor memory devices M31 to M3n may input data and output data through some of the terminals of the right data terminals DQRP in response to a third command/address signal ca21, and the n semiconductor memory devices M41 to M4n may input and output data through the remaining terminals of the right data terminals DQRP in response to a fourth command/address signal ca22. For example, when the memory module 100 includes 20 semiconductor memory devices M11 to M1n, M21 to M2n, M31 to M3n, and M41 to M4n (n=5), and each of the 20 semiconductor memory devices M11 to M1n, M21 to M2n, M31 to M3n, and M41 to M4n inputs and outputs 4-bit data through 4 data terminals, the memory module 100 may input and output 80-bit data through 40 left data terminals DQLP and 40 right data terminals DQRP.

The serial presence detector (SPD) 12 may perform global data communication (for example, data communication according to an I2C (Inter-Integrated Circuit) or I3C (Improved Inter-Integrated Circuit) communication protocol) through a channel including the serial clock signal terminal SCLP and the serial data terminal SDAP. The serial presence detector 12 may detect a passive element (for example, a resistor) connected to a module position identification terminal (MIDP), and generate a module identification (ID). For example, the serial presence detector 12 may detect a current or a voltage of the module position identification terminal MIDP, and generate the module ID. Unlike the configuration shown, the serial presence detector 12 may detect voltages (for example, an external power supply voltage and/or a ground voltage applied to the memory module 100) connected to at least two module position identification terminals, and generate the module ID. The serial presence detector 12 may perform local data communication (for example, data communication according to the I2C or I3C communication protocol) with the power management unit 14, the temperature sensor 16, and the register clock driver 18, through a channel including the local serial clock signal line LSCLL and the local serial data line LSDAL. The serial presence detector 12 may perform the local data communication with the power management unit 14 to transmit the module ID or a register address corresponding to the module ID.

The power management unit 14 may generate a predetermined number of internal power supply voltages using an external power supply voltage, and perform the local data communication with the serial presence detector 12. The power management unit 14 may set an on-time point and/or an off-time point of an internal clock signal based on the module ID transmitted from the serial presence detector 12. The power management unit 14 may set the on-time point and/or the off-time point of the internal clock signal based on the register address corresponding to the module ID transmitted from the serial presence detector 12. Although not shown, the power management unit 14 may apply the predetermined number of internal power supply voltages to the 4n semiconductor memory devices M11 to M1n, M21 to M2n, M31 to M3n, and M41 to M4n, the serial presence detector 12, the temperature sensor 16, and the register clock driver 18.

The temperature sensor 16 may sense a temperature and perform the local data communication with the serial presence detector 12. The register clock driver 18 may input a first command/address applied through the first command/address terminals CA1P to generate the first command/address signal ca11 and the second command/address signal ca12, and may input a second command/address applied through the second command/address terminals CA2P to generate the third command/address signal ca21 and the fourth command/address signal ca22. Further, the register clock driver 18 may perform the local data communication with the serial presence detector 12. As can be seen from the above description, when performing the local data communication, the serial presence detector 12 may operate as a master, and the serial presence detector 14, the temperature sensor 16, and the register clock driver 18 may operate as slaves.

Figure 2:
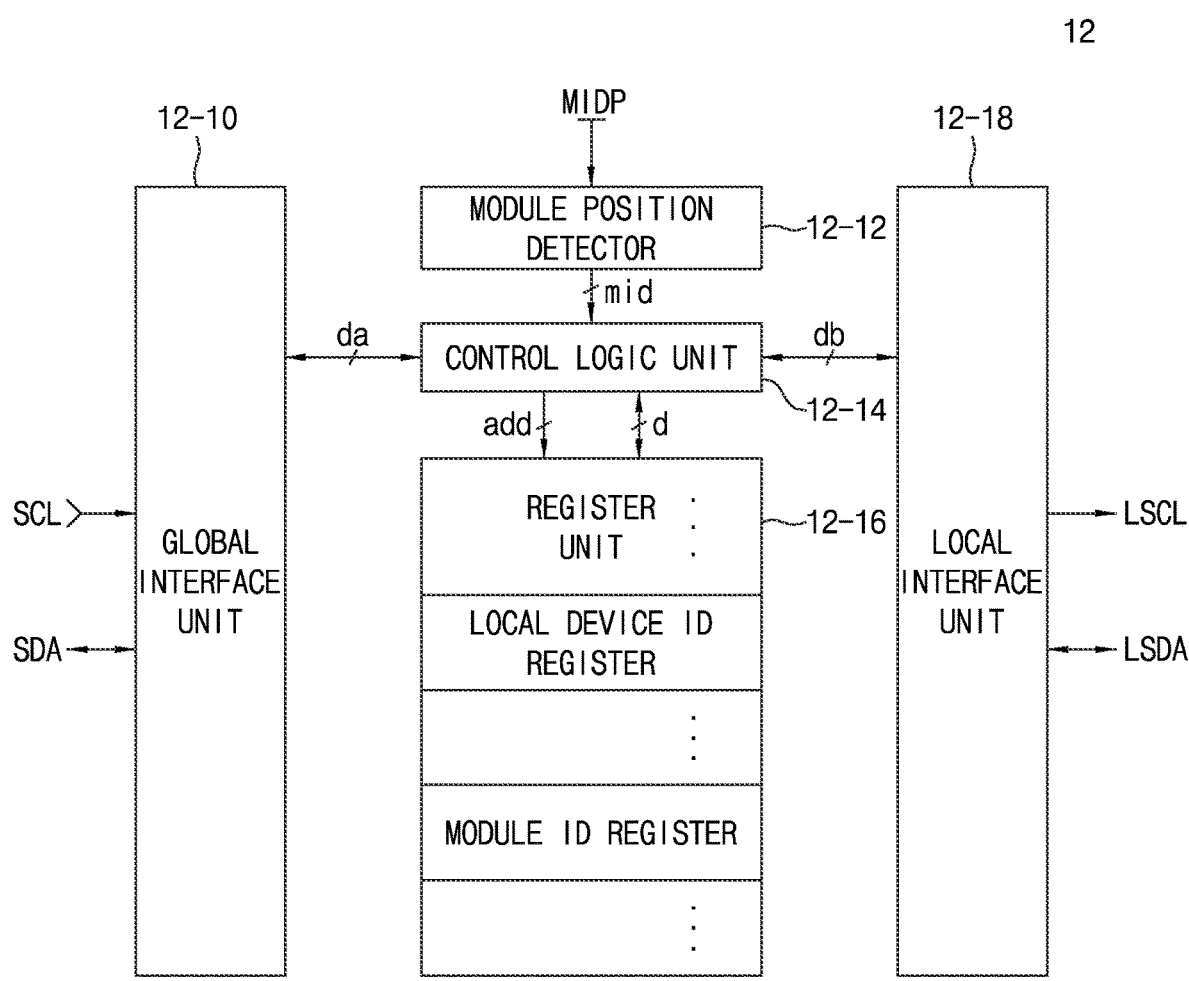
FIG. 2 is a block diagram illustrating a configuration of a serial presence detector according to an example embodiment of the inventive concept.

FIG. 2 is a block diagram illustrating a configuration of the serial presence detector according to an example embodiment of the inventive concept, the serial presence detector 12 may include a global interface unit 12-10, a module position detector 12-12, a control logic unit 12-14, a register unit 12-16, and a local interface unit 12-18.

A function of each of the blocks shown in FIG. 2 is described below.

The global interface unit 12-10 may input and output serial data SDA in response to a global serial clock signal SCL applied from the outside. For example, the global interface unit 12-10 may perform global data communication based on an I2C or I3C communication protocol. Further, the global interface unit 12-10 may convert the serial data SDA received in series into data da generated in parallel, or convert the data da received in parallel into the serial data SDA generated in series. When performing the global data communication, the serial presence detector 12 may operate as a slave.

The module position detector 12-12 may sense a passive element (for example, a resistor (not shown)) connected to a module position identification terminal MIDP (refer to FIG. 1), and generate a module ID "mid". When the passive element is connected to the module position identification terminal MIDP, the module position detector 12-12 may sense a current flowing through the module position identification terminal MIDP or a voltage of the module position identification terminal MIDP, and generate the module ID mid. When the module ID mid is received, the control logic unit 12-14 may generate a register address add indicating a module ID register, generate the module ID mid as data d, and store the module ID in a module ID register. When the module ID is received, the control logic unit 12-14 may generate the register address of the module ID register of the power management unit 14 and the module ID as data db. Alternatively, the control logic unit 12-14 may generate the register address corresponding to the module ID of the power management unit 14 as the data db. When the data da is received, the control logic unit 12-14 may determine whether both a local device ID and a module ID included in the data da match both a corresponding local device ID (that is, a local device ID of the serial presence detector 12, for example, 4-bit data "1010") stored in a local device ID register and a corresponding module ID (that is, a module ID of the memory module 100, for example, 3-bit data "010") stored in the module ID register, and if the two IDs match, the control logic unit 12-14 may receive the data da and generate a register address included in the data da as a register address add, and store the data d in the register of the register unit 12-16 corresponding to the register address add or receive the data d output from the register of the register unit 12-16 corresponding to the register address add to generate the data da. If only the module IDs match and the local device IDs do not match, the control logic unit 12-14 may receive the data da to generate the data da. That is, when the control logic unit 12-14 determines that the data da is related to other local devices (for example, the power management unit 14, the temperature sensor 16, or the register clock driver 18) of a corresponding memory module, the control logic unit 12-14 may receive the data da to generate the data db.

The register unit 12-16 may include a plurality of registers including a local device ID register and a module ID register, and the plurality of registers may be selected in response to the register address add to store the data d, or output stored data as the data d. The local device ID register may previously store the local device ID (for example, "1010") of the serial presence detector 12, the local device ID (for example, "1001") of the power management unit 14, the local device ID (for example, "0010") of the temperature sensor 15, and the local device ID (for example, "1011") of the register clock driver 18.

The local interface unit 12-18 may receive the data db, and output local serial data LSDA in response to the local serial clock signal LSCL. Further, the local interface unit 12-18 may receive the local serial data LSDA in response to the local serial clock signal LSCL to generate the data db. The local interface unit 12-18 may convert the data db received in parallel into the local serial data LSDA generated in series, or convert the local serial data LSDA received in series into the data db generated in parallel.

Figure 3:
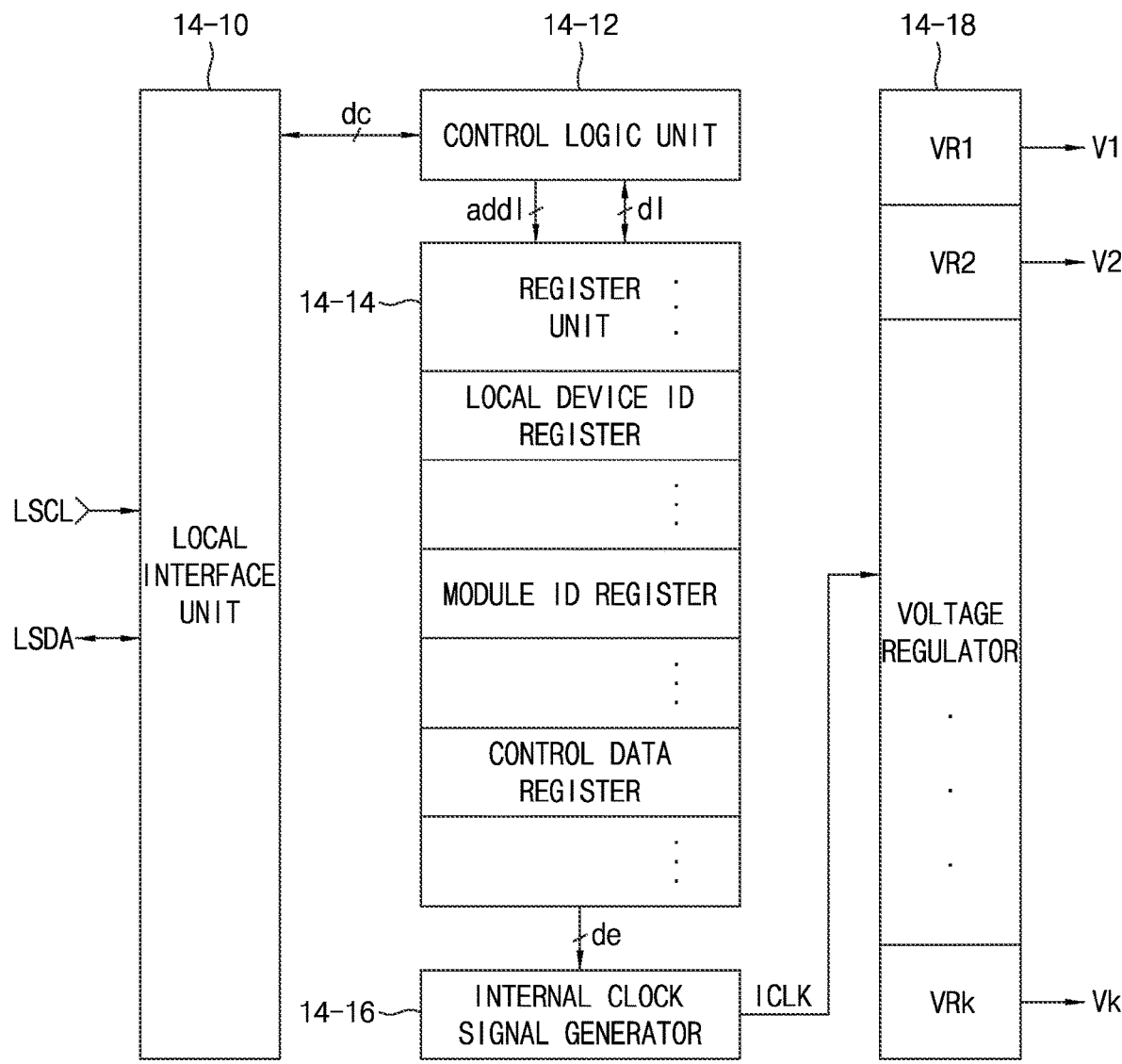
FIG. 3 is a block diagram illustrating a configuration of a power management unit according to an example embodiment of the inventive concept.

FIG. 3 is a block diagram illustrating a configuration of a power management unit according to an example embodiment of the inventive concept, and the power management unit 14 may include a local interface unit 14-10, a control logic unit 14-12, a register unit 14-14, an internal clock signal generator 14-16, and a voltage regulator 14-18.

A function of each of the blocks shown in FIG. 3 will be described below.

The local interface unit 14-10 may input and output the local serial data LSDA in response to the local serial clock signal LSCL. For example, the local interface unit 14-10 may perform local serial data communication based on an I2C or I3C communication protocol. Further, the local interface unit 14-10 may convert the local serial data LSDA received in series into data da generated in series into data dc generated in parallel, or convert the data dc received in parallel into the local serial data LSDA generated in series.

When the data dc is received, the local device ID included in the data dc matches a corresponding local device ID (for example, "1001") stored in the local device ID register, and the module ID included in the data dc indicates a corresponding module ID (for example, "010"), the logic control unit 14-12 may receive the data dc to generate the register address included in the data dc as a register address add1, and store data dl in a register corresponding to the register address add1 or receive the data dl output from the register corresponding to the register address add1 to generate the data dc. As one example, when the local device ID matches the corresponding local device ID, the module ID indicates the corresponding module ID, and the register address add1 is a register address of the module ID register, the control logic unit 14-12 may store the module ID in the module ID register, and output control data of a control data register corresponding to the module ID. As another example, when the local device ID matches the corresponding local device ID, and the module ID indicates the corresponding module ID, and the register address add1 is the register address of the control data register corresponding to the module ID, the control logic unit 14-12 may output control data stored in the control data register.

The register unit 14-14 may include a plurality of registers including a corresponding local device ID register, a module ID register, and a plurality of control data registers, and the plurality of registers may be selected in response to the register address add1 to store the data dl, or output stored data as the data dl. A plurality of pieces of control data may be previously stored in the plurality of control data registers. As one example, the plurality of control data registers may be configured to output one of the plurality of pieces of control data in response to the module ID stored in the module ID register. As another example, the plurality of control data registers may be configured to generate one of the plurality of pieces of control data in response to the register address.

The internal clock signal generator 14-16 may set an on-time point and/or an off-time point of the internal clock signal ICLK in response to control data de. The voltage regulator 14-18 may include k internal power supply voltage generators VR1 to VRk generating k internal power supply voltages VR1 to VRk which are the same or different from each other. Each of the k internal power supply voltages VR1 to VRk may generate the k internal power supply voltages V1 to Vk using (pumping down) an external power supply voltage (for example, 12V) applied from the outside.

Each of the k internal power supply voltage generators VR1 to VRk may be a buck converter.

Figure 4:
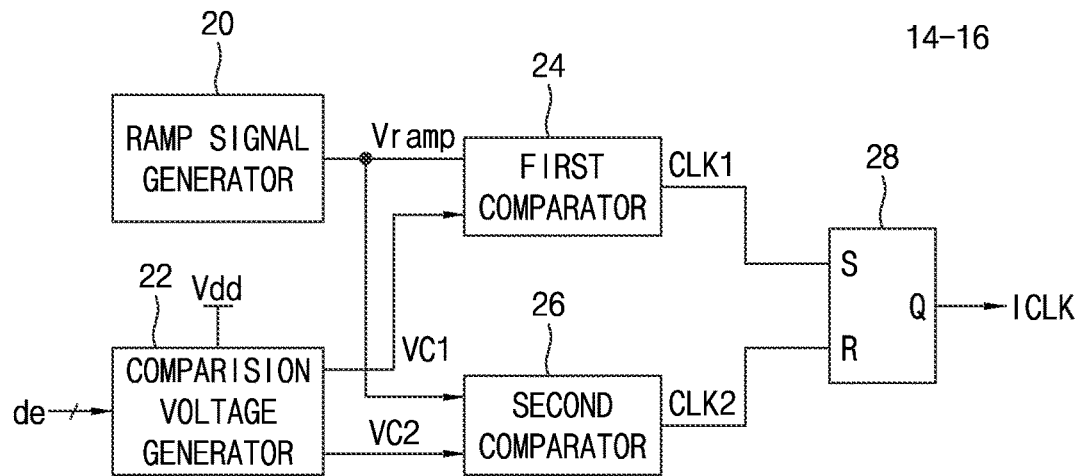
FIG. 4 is a block diagram illustrating a configuration of an internal clock signal generator according to an example embodiment of the inventive concept.
Figure 5:
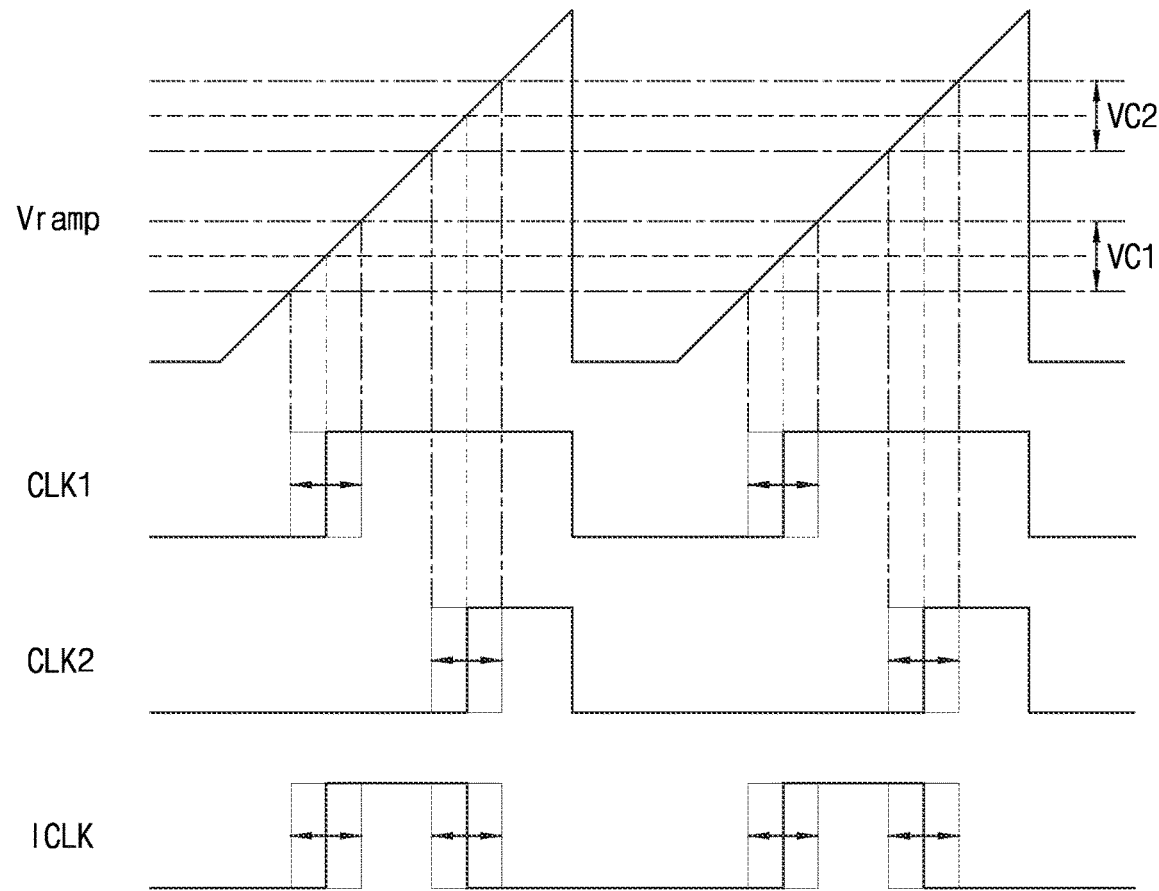
FIG. 5 is an operational timing diagram for describing an operation of the internal clock signal generator shown in FIG. 4.

FIG. 4 is a block diagram illustrating a configuration of an internal clock signal generator according to an example embodiment of the inventive concept, the internal clock signal generator 14-16 may include a ramp signal generator 20, a comparison voltage generator 22, a first comparator 24, a second comparator 26, and a latch 28. FIG. 5 is an operational timing diagram for describing an operation of the internal clock signal generator shown in FIG. 4.

An operation of each of the blocks will be described below with reference to FIGS. 4 and 5.

The ramp signal generator 20 may generate a ramp signal Vramp. The comparison voltage generator 22 may generate a first comparison voltage VC1 and a second comparison voltage VC2 using an external power supply voltage in response to control data de. The first comparison voltage VC1 is greater than the second comparison voltage VC2. The first comparator 24 may generate a first clock signal CLK1 of increasing to a logic "high" level when a voltage of the ramp signal Vramp is equal to or greater than the first comparison voltage VC1, and of decreasing to a logic "low" level when the voltage of the ramp signal Vramp is smaller than the first comparison voltage VC1. The second comparator 26 may generate a second clock signal CLK2 of increasing to a logic "high" level when the voltage of the ramp signal Vramp is equal to or greater than the second comparison voltage VC2, and of decreasing to a logic "low" level when the voltage of the ramp signal Vramp is smaller than the second comparison voltage VC2.

The latch 28 may generate an internal clock signal ICLK of increasing to a logic "high" level in response to the first clock signal CLK1 which is at the logic "high" level, and of decreasing to a logic "low" level in response to the second clock signal CLK2 which is at the logic "high" level. The latch 28 may be an SR latch. In the internal clock signal generator 14-16 shown in FIG. 4, the first comparison voltage VC1 may be variably set along an arrow direction shown in FIG. 5 and the second comparison voltage VC2 may be variably set along an arrow direction shown in FIG. 5 in response to the control data de. Accordingly, the on-time point of the first clock signal CLK1 and the on-time point of the second clock signal CLK2 may be variably set, and thus the on-time point and the off-time point of the internal clock signal ICLK may be variably set.

As another example, the first comparison voltage VC1 may be variably set, and the second comparison voltage VC2 may be fixed. Accordingly, the on-time point of the first clock signal CLK1 may be variably set and the on-time point of the on-time point of the second clock signal CLK2 may be fixed, and thus the on-time point of the internal clock signal ICLK may be varied and the off-time point of the internal clock signal ICLK may be fixed. Further, as another example, the first comparison voltage VC1 may be fixed and the second comparison voltage VC2 may be variably set. Accordingly, the on-time point of the first clock signal CLK1 may be fixed and the on-time point of the second clock signal CLK2 may be variably set, and thus the on-time point of the internal clock signal ICLK may be fixed and the off-time point of the internal clock signal ICLK may be variably set. That is, the internal clock signal generator 14-16 shown in FIG. 4 may variably set the on-time point and/or the off-time point of the internal clock signal ICLK in response to the control data de.

Figures 6, 7:
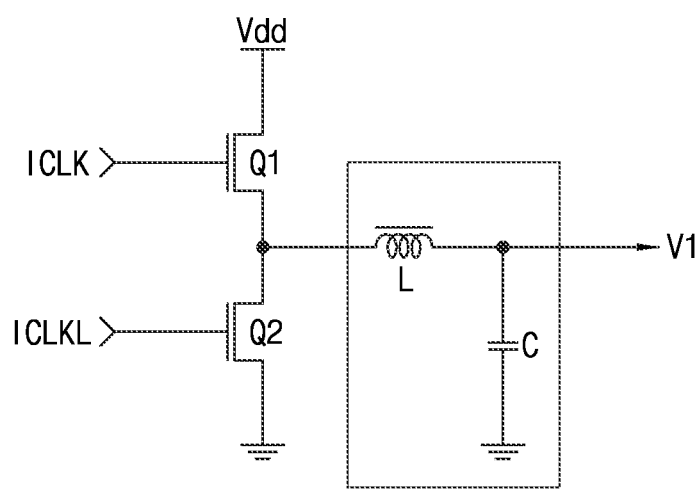
FIG. 6 is a diagram illustrating a configuration of a voltage generator according to an example embodiment of the inventive concept.
FIG. 7 is a table illustrating control data according to module IDs of a plurality of control data registers of a register unit according to an example embodiment of the inventive concept.

FIG. 6 is a diagram illustrating a configuration of a voltage generator according to an example embodiment of the inventive concept, and the voltage generator VR1 shown in FIG. 6 may include a high-side switching transistor Q1, a low-side switching transistor Q2, an inductor L, and a capacitor C.

Referring to FIG. 6, the internal clock signal ICLK may be applied to the high-side switching transistor Q1, an internal clock signal ICLKL may be applied to the low-side switching transistor Q2. The high-side switching transistor Q1 may be turned on in response to the internal clock signal ICLK which is at a logic "high" level, and the low-side switching transistor Q2 may be turned on in response to the internal clock signal ICLKL which is at the logic "high" level. The voltage generator shown in FIG. 6 illustrates a well-known buck converter, and the buck converter may perform a switching operation in response the internal clock signals ICLK and ICLKL, and generate an internal power supply voltage V1 using (pumping down) the external power supply voltage Vdd.

FIG. 7 is a table illustrating control data according to module IDs of a plurality of control data registers of a register unit according to an example of the inventive concept.

Referring to FIG. 7, 8 different control data C1 to C8 may be stored in 8 control data registers corresponding to 8 module IDs (for example, "000", "001", "010", "011", "100", "101", "110", and "111"). The 8 control data registers may be configured to output corresponding control data according to the module ID stored in the module ID register. Alternatively, the 8 control data registers may be configured to output the 8 different control data C1 to C8 in response to 8 different register addresses corresponding to the 8 module IDs. Each of the plurality of register addresses may be a predetermined number of bits of digital data (for example, 8-bit data or more), and each of the plurality of pieces of control data D1 to D8 may be a predetermined number of bits of digital data (for example, 8-bit or more data).

Referring to FIGS. 4 to 7, in the internal clock signal generator 14-16, the first comparison voltage VC1 and/or the second comparison voltage VC2 may be varied in response to the 8 different control data C1 to C8, and thus the on-time point and/or the off-time point of the internal clock signal ICLK may be variably set. For example, the internal clock signal generator 14-16 may generate the internal clock signal ICLK having a basic frequency in response to the control data C5, differently advance the on-time point and/or the off-time point of the internal clock signal ICLK in response to the control data C6 to C8, and differently delay the on-time point and/or the off-time point of the internal clock signal ICLK in response to the control data C1 to C4. In this case, the basic frequency of the internal clock signal ICLK may be maintained or varied in response to the control data C1 to C8.

FIG. 8 is an operational timing diagram for describing local data communication between a serial presence detector and a power management unit PMU according to an example embodiment of the inventive concept, and is a diagram for describing an operation in which the serial presence detector 12 writes a module ID to the power management unit 14 according to an I2C protocol.

Referring to FIG. 8, when the module ID mid is received, the serial presence detector 12 may perform the local data communication for transmitting the module ID mid to the power management unit 14.

First, the serial presence detector 12 may transmit a start signal START to the power management unit 14. The serial presence detector 12 may transmit an 8-bit local device address, that is, a 4-bit local device ID 16 to 13 (for example, the local device ID of the power management unit 14, "1001")+a 3-bit module ID 12 to 10 (for example, "111") indicating to be a corresponding module ID (for example, "010")+one-bit write command (for example, "0" indicating to be a write command) as the local serial data LSDA by one bit in response to a local serial clock signal LSCL. The power management unit 14 may receive the local device address, and when the local device address includes the corresponding local device ID and a module ID indicating to be the corresponding module ID, transmit a reception acknowledgement signal ACK to the serial presence detector 12 as the local serial data LSDA.

Next, the serial presence detector 12 may transmit an 8-bit register address A7 to A0, for example, the register address of the module ID register of the register unit 14-14 shown in FIG. 3, to the power management unit 14 as the local serial data LSDA by one bit in response to the local serial clock signal LSCL. When the register address is received, the power management unit 14 may transmit a reception acknowledgement signal ACK to the serial presence detector 12.

Lastly, the serial presence detector 12 may transmit data D7 to D0 including the 3-bit module ID D2 to D0, for example, "00000"+the 3-bit module ID (for example, "010") to the power management unit PMU 14 as the local serial data LSDA by one bit in response to the local serial clock signal LSCL. When the module ID is received, the power management unit 14 may transmit a reception acknowledgement signal ACK to the serial present detector 12. The power management unit 14 may store the data D7 to D0 in the module ID register of the register unit 14-14. The power management unit PMU 14 may generate the data D7 to D0 stored in the module ID register or the control data de stored in the control data register according to the module ID D2 to D0.

The serial presence detector 12 may end the communication by transmitting a reception non-acknowledgement signal NACK and a stop signal STOP to the power management unit 14 after transmitting the data D7 to D0 to the power management unit 14. According to the example embodiment shown in FIG. 8, when the serial presence detector 12 transmits the module ID to the power management unit PMU 14, the power management unit 14 may generate the control data de from the control data register corresponding to the module ID.

FIG. 9 is an operational timing diagram for describing local data communication between a serial presence detector and a power management unit according to an example embodiment of the inventive concept, and is a diagram for describing an operation in which the serial presence detector 12 reads control data from the power management unit 14 according to an I2C protocol.

Referring to FIG. 9, when the module ID mid is received, the serial presence detector 12 may transmit a start signal START to the power management unit 14. The serial presence detector 12 may transmit an 8-bit local device address, that is, a four-bit local device ID 16 to 13 (for example, "1001")+a 3-bit module ID (for example, "111") indicating to be a corresponding module ID (for example, "010")+1-bit write command (for example, "0") to the power management unit 14 as the local serial data LSDA by one bit in response to the local serial clock signal LSCL. The power management unit 14 may receive the local device address, and when the local device address includes the corresponding local device ID and the module ID indicating to be the corresponding module ID, transmit a reception acknowledgement signal ACK to the serial presence detector 12 as the local serial data LSDA.

Next, the serial presence detector 12 may transmit an 8-bit register address A7 to A0, for example, a register address corresponding to a corresponding module ID among the register addresses of the plurality of control data registers of the register unit 14-14 shown in FIG. 3 to the power management unit 14 as the local serial data LSDA by one bit in response to the local serial clock signal LSCL. When the register address is received, the power management unit 14 may transmit a reception acknowledgement signal ACK to the serial presence detector 12 as the local serial data LSDA.

Next, the serial presence detector 12 may transmit a restart signal R START to the power management unit 14. The serial presence detector 12 may an 8-bit local device address, that is, a 4-bit local device address 16 to 13 (for example, "1001")+a 3-bit module ID 12 to 10 (for example, "111) indicating to be a corresponding module ID (for example, "010")+1-bit read command (for example, "1" indicating a read command) to the power management unit PMU 14 as the local serial data LSDA by one bit in response to the local serial clock signal LSCL. When the register address is received, the power management unit 14 may transmit a reception acknowledgement signal ACK to the serial presence detector 12 as the local serial data LSDA.

The power management unit 14 may transmit a reception acknowledgement signal ACK to the serial presence detector 12. The power management unit 14 may generate control data de from one selected among the plurality of control data registers in response to the register address. Accordingly, the on-time point and/or the off-time point of the internal clock signal ICLK may be set. The power management unit 14 may transmit data D7 to D0 corresponding the control data de to the serial presence detector 12.

The serial presence detector 12 may transmit a reception non-acknowledgement signal NACK and a stop signal STOP after receiving the data D7 to D0 from the power management unit 14, and end the communication.

According to the example embodiment shown in FIG. 9, when the serial presence detector 12 transmits the register address corresponding to the module ID to the power management unit 14, the power management unit 14 may generate the control data de from the control data register corresponding to the register address.

FIG. 10 is an operational timing diagram for describing global data communication between an external device and a serial presence detector according to an example embodiment of the inventive concept, for example, and is a diagram for describing an operation in which the external device transmits data to the serial presence detector 12.

Referring to FIG. 10, the external device may transmit a start signal START to the serial presence detector 12. The external device may transmit an 8-bit local device address, that is, a 4-bit local device ID 16 to 13 (for example, "1001")+a 3-bit corresponding module ID 12 to 10 (for example, "010")+1-bit write command (for example, "0") to the serial present detector 12, as global serial data SDA by one bit in response to a global serial clock signal SCL. The serial presence detector 12 may receive the local device address, and when the local device address includes the corresponding local device ID and the corresponding module ID, transmit a reception acknowledgement signal ACK to the external device as the global serial data.

Next, the external device may transmit an 8-bit register address A7 to A0, for example, a register address corresponding to a corresponding module ID among register addresses of the plurality of control data registers of the register unit 14-14 shown in FIG. 3 to the serial presence detector 12 as the global serial data SDA by one bit in response to the global serial clock signal SCL. When the register address is received, the serial presence detector 12 may transmit a reception acknowledgement signal ACK to the external device as the global serial data SDA.

Next, the external device may transmit a restart signal R START to the serial presence detector 12. The external device may transmit an 8-bit local device address, that is, a 4-bit local device ID 16 to 13 (for example, "1001")+a 3-bit corresponding module ID (for example, "010")+1-bit read command (for example, "1" indicating a read command) to the serial presence detector 12 as the global serial data SDA by one bit in response to the global serial clock signal SCL. When the register address is received, the serial presence detector 12 may transmit a reception acknowledgement signal ACK to the external device as the global serial data SDA.

FIG. 11 is an operational timing diagram for describing local data communication between a serial presence detector and a power management unit according to an example embodiment of the inventive concept, for example, is a diagram for describing an operation in which the serial presence detector 12 transmits data related to the power management unit 14 transmitted from the external device to the power management unit 14.

The operational timing diagram shown in FIG. 11 may be the same as that shown in FIG. 9, and will be easily understood with reference to the description of FIG. 9 described above.

According to the example embodiments shown in FIGS. 10 and 11, the external device may transmit the register address corresponding to the module ID to the serial presence detector 12, the serial presence detector 12 may the register address to the power management unit 14, and the power management unit 14 may generate the control data de from the control data register corresponding to the register address.

Figure 12:
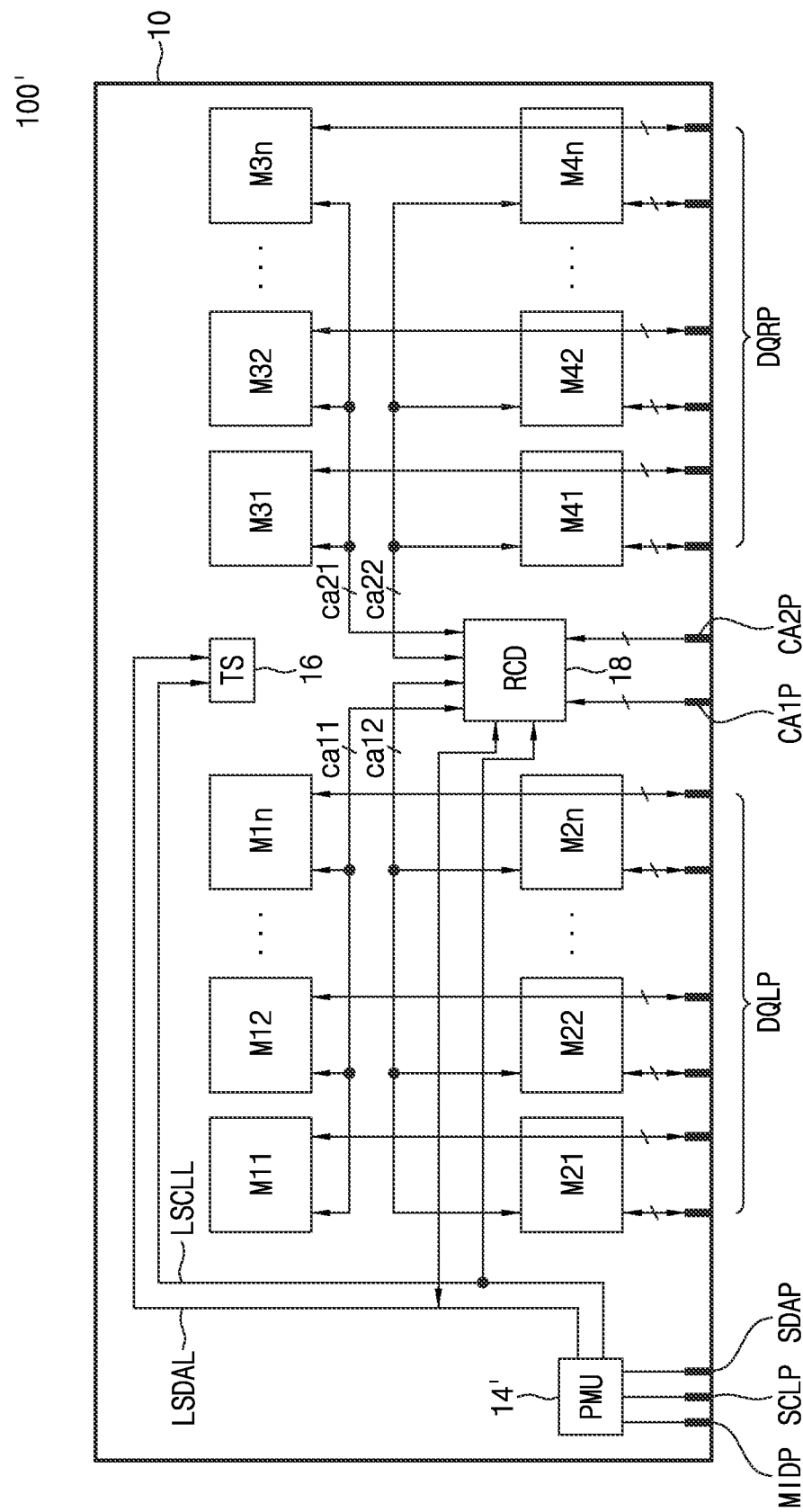
FIG. 12 is a block diagram illustrating a configuration of a memory module according to an example embodiment of the inventive concept.

FIG. 12 is a block diagram illustrating a configuration of a memory module according to an example embodiment of the inventive concept, and the memory module 100' shown in FIG. 12 may be configured to exclude the power management unit 12 of the memory module 100 shown in FIG. 1 and include a power management unit 14' instead of the power management unit 14 shown in FIG. 1.

Referring to FIG. 12, the power management unit 14' may perform the global data communication according to a serial data communication protocol through a channel including the serial clock signal terminal SCLP and the serial data terminal SDAP. The power management unit 14' may detect a passive element (for example, a resistor) connected to a module position identification terminal MIDP, and generate a module ID mid. The power management unit 14' may detect a current or a voltage of the module position identification terminal MIDP, and generate the module ID mid. Unlike the configuration shown in FIG. 12, the power management unit 14' may detect voltages connected at least two module position identification terminals (for example, an external power supply voltage and/or a ground voltage applied to the memory module 100'), and generate the module ID mid. The power management unit 14' may perform the local data communication with the temperature sensor 16, and the register clock driver 18 through a channel including the local serial clock signal line LSCLL and the local serial data line LSDAL.

The power management unit 14' may generate a predetermined number of internal power supply voltages using the external power supply voltage. When the module ID mid is received, the power management unit 14' may store the module ID in the module ID register. The power management unit 14' may set the on-time point or/and the off-time point of the internal clock signal ICLK based on the module ID stored in the module ID register. Alternatively, the power management unit 14' may set the on-time point or/and the off-time point of the internal clock signal ICLK based on the register address corresponding to the module ID.

Although not shown, the power management unit 14' may apply the predetermined number of internal power supply voltages to the 4n semiconductor memory devices M11 to M1n, M21 to M2n, M31 to M3n, and M41 to M4n, the temperature sensor 16, and the register clock driver 18.

Figure 13:
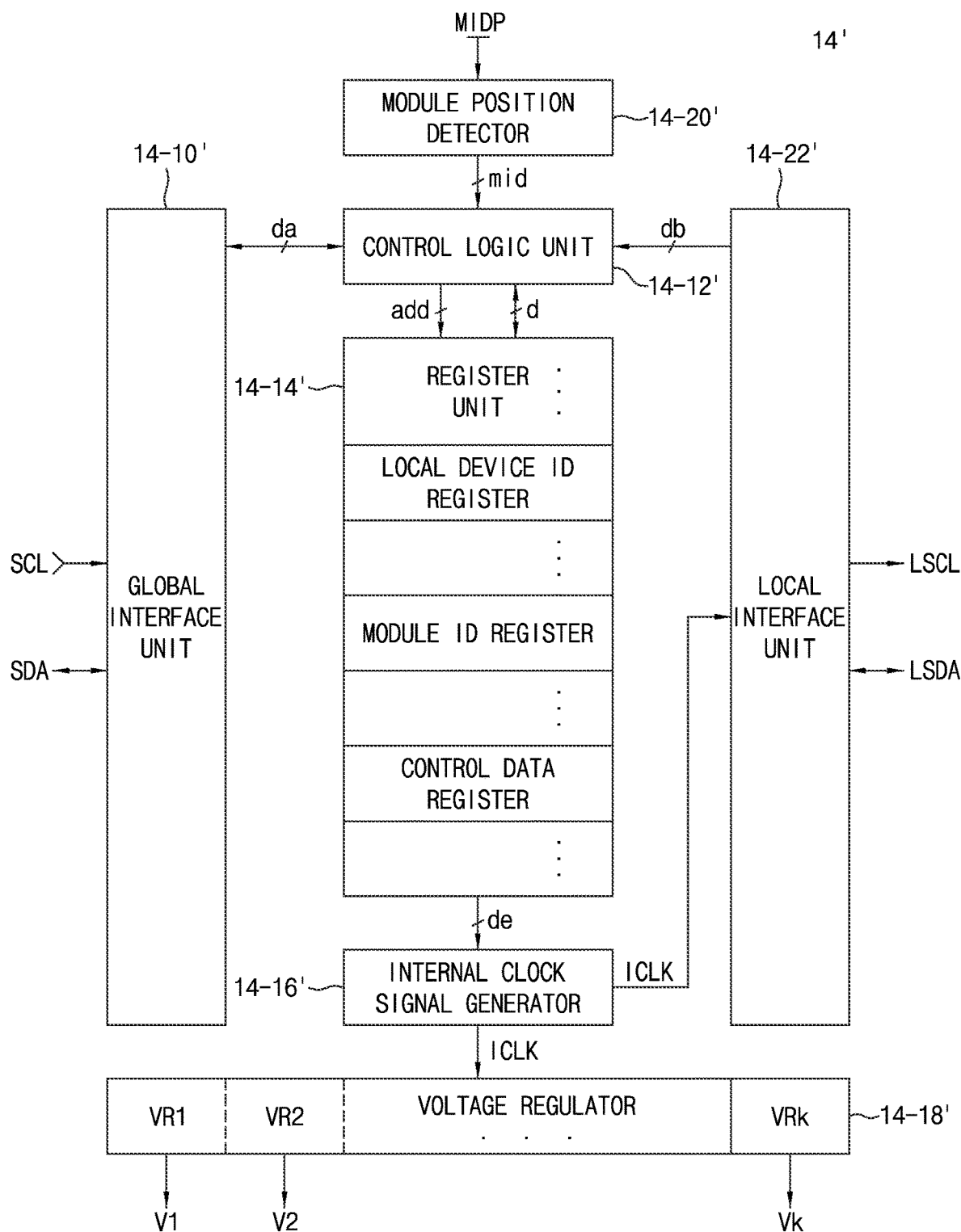
FIG. 13 is a block diagram illustrating a configuration of a power management unit according to an example embodiment of the inventive concept.

FIG. 13 is a block diagram illustrating a configuration of a power management unit according to an example embodiment of the inventive concept, and the power management unit 14' may include a global interface unit 14-10', a control logic unit 14-12', a register unit 14-14', an internal clock signal generator 14-16', a voltage regulator 14-18', a module position detector 14-20', and a local interface unit 14-22'.

A function of each of the blocks shown in FIG. 13 will be described hereinbelow.

The global interface unit 14-10', the control logic unit 14-12', the register unit 14-14', and the module position detector 14-20' may perform the same function as the global interface unit 12-10, the control logic unit 12-14, the register unit 12-16, and the module position detector 12-12 shown in FIG. 2, respectively.

The internal clock signal generator 14-16', and the voltage regulator 14-16' may perform the same function as the internal clock signal generator 14-16, and the voltage regulator 14-18 shown in FIG. 3, respectively.

That is, the power management unit 14' shown in FIG. 13 may have a configuration in which both the serial presence detector 12 shown in FIG. 2 and the power management unit 14 shown in FIG. 3 are integrated. Accordingly, the power management unit 14' may perform the local data communication with the serial presence detector 12 and not adjust the on-time point and/or the off-time point of the internal clock signal ICLK, and when the module ID mid is received, set the on-time point and/or the off-time point of the internal clock signal ICLK in response to the control data de generated according to the module ID mid or the register address corresponding to the module ID mid. The power management unit 14' may directly perform the global data communication with the external device, and receive the register address corresponding to the module ID mid and set the on-time point and/or the off-time point of the internal clock signal ICLK in response to the control data de generated according to the register address.

When the module ID mid is received, the control logic unit 14-12' may generate the register address of the module ID register as an address add1, and generate the module ID mid as data d. As another example, when the module ID mid is received, the control logic unit 14-12' may generate the register address corresponding the module ID mid as the address add1. Further, as another example, when the data da is received, the control logic unit 14-12' may generate a register address of one among the plurality of control data registers included in the data da as the address add1.

The register unit 14-14' may store the module ID in the module ID register, and generate one among the plurality of pieces of control data as the control data de in response to the module ID. As another example, the register unit 14-14' may generate the control data de from the control data register corresponding to the register address.

The internal clock signal generator 14-16' may set the on-time point and/or the off-time point of the internal clock signal ICLK in response to the control data de.

Figure 14:
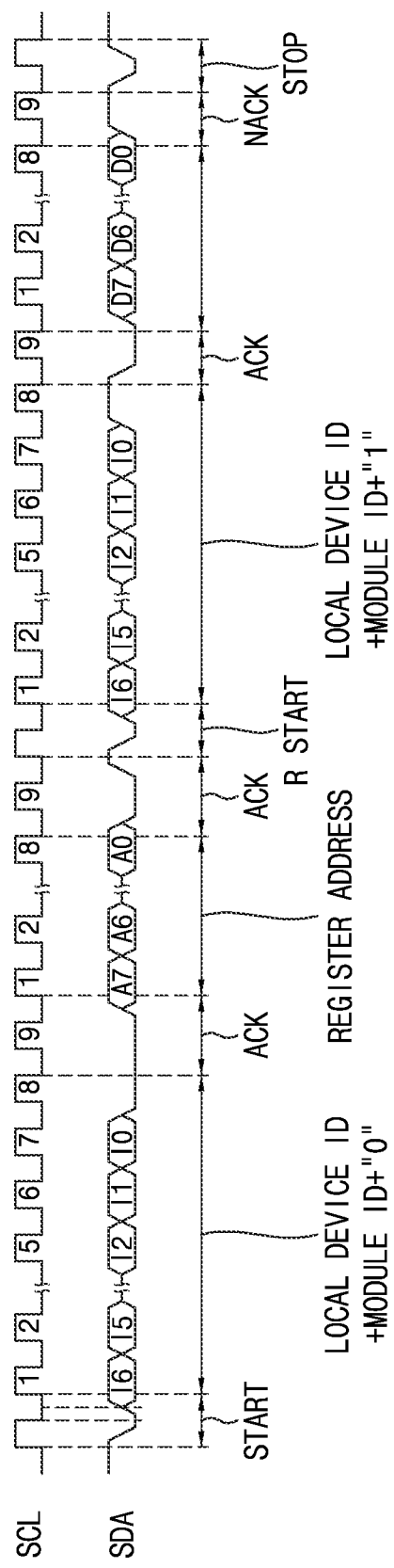
FIG. 14 is an operational timing diagram for describing global data communication between an external device and a power management unit according to an example embodiment of the inventive concept.

FIG. 14 is an operational timing diagram for describing global data communication between an external device and a power management unit according to an example embodiment of the inventive concept, for example, and is a diagram for describing an operation in which the external device reads data from the power management unit 14' according to an I2C protocol.

The operational timing diagram shown in FIG. 14 may be the same as that shown in FIG. 11 when excluding that the external device transmits not the module ID (for example, "111") indicating to be a corresponding module ID (for example, "010") but the corresponding module ID (for example, "010") when transmitting the local device address to the power management unit 14'. Accordingly, the power management unit 14' may output the control data de from the control data register corresponding to the register address among the plurality of control data registers of the register unit 14-14'. The power management unit 14' may set the on-time point and/or the off-time point of the internal clock signal ICLK according to the control data de. Furthermore, the power management unit 14' may transmit the data D7 to D0 corresponding to the control data de to the external device, and the external device may transmit a reception non-acknowledgement signal NACK and a stop signal STOP after receiving the data D7 to D0, and end the communication.

Figure 15:
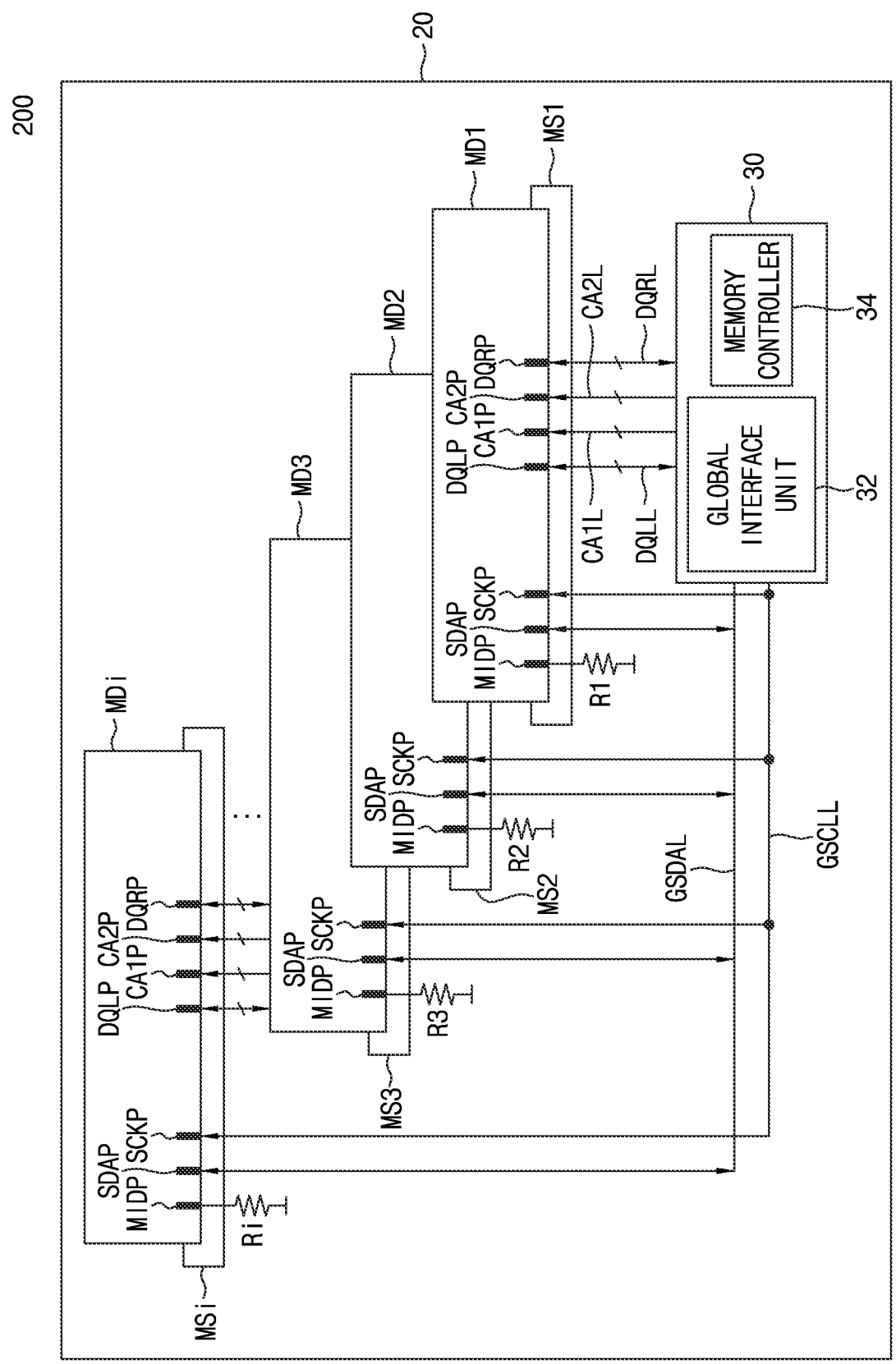
FIG. 15 is a block diagram illustrating a configuration of a memory system according to an example embodiment of the inventive concept.

FIG. 15 is a block diagram illustrating a configuration of a memory system according to an example embodiment of the inventive concept, and the memory system 200 may include a control unit 30, i module slots MS1 to MSi, and i memory modules MD1 to MDi, which are mounted on a main board 20.

Referring to FIG. 15, the memory system 200 may include i module ID resistors R1 to Ri connected to the i module slots MS1 to MSi. The i module ID resistors R1 to Ri may be connected to an external power supply voltage Vdd line arranged on the main board 20, and have different resistances. The i module ID resistors R1 to Ri may be connected to the module position identification terminals MIDP of the i memory modules MD1 to MDi, respectively. The control unit 30 may include a global interface unit 21, and a memory controller 34. Left data lines DQLL, first command/address lines CA1L, second command/address lines CA2L, right data lines DQRL, a global serial data line GSDAL, and a global serial clock signal line GSCLL may be arranged on the main board 20.

Although not shown, the left data lines DQLL, the first command/address lines CA1L, the second command/address lines CA2L, and the right data lines DQRL may be commonly connect to the left data terminals DQLP, the first command/address terminals CA1P, the second command/address terminals CA2, and the right data terminals DQRP, respectively, of each of the i memory modules MD1 to MDi. Further, the global serial data line GSDAL, and the global serial clock signal line GSCLL may be commonly connected to the serial data terminal SDAP and the serial clock signal terminal SCKP, respectively, of each of the i memory modules MD1 to MDi.

Referring to FIG. 15, when each of the i memory modules MD1 to MDi is mounted in a corresponding module slot MS1, MS2, . . . , or MSi, each of the i memory modules MD1 to MDi may detect a corresponding module ID resistor R1, R2, . . . , or Ri connected to a corresponding module position identification terminal MIDP, and identify a corresponding module ID. For example, when each of 8 memory modules MD1 to MD8 are mounted in the corresponding module slot MS1, MS2, . . . , or MS8, each of the 8 memory modules MD1 to MD8 may identify "000", "001", "010", "011", "100", "101", "110", or "111" as the corresponding module ID.

The i memory modules MD1 to MDi shown in FIG. 15 may have the configuration and perform the operation described above with reference to FIGS. 1 to 11, and when the module ID mid is received, the serial presence detector 12 may perform the local data communication with the power management unit 14 to transmit the module ID or the register address corresponding to the module ID, and the power management unit 14 may generate the control data de according to the module ID or the register address corresponding to the module ID. Alternatively, the global data communication and the local data communication are performed between the control unit 30, the serial presence detector 12, and the power management unit 14, and the register address is transmitted to the power management unit 14, and thus the power management unit 14 may generate the control data de. Accordingly, the on-time point and/or the off-time point of the internal clock signals ICLK of the i memory modules MD1 to MDi may be differently set.

Further, the i memory modules MD1 to MDi shown in FIG. 15 may have the configuration and perform the operation described above with reference to FIGS. 12 to 14, and when the module ID mid is received, the power management unit 14' may generate the control data de according to the module ID or the register address corresponding to the module ID. Alternatively, the global data communication is performed between the control unit 30 and the power management unit 14', and the register address is transmitted to the power management unit 14', and thus the power management unit 14' may generate the control data de. Accordingly, the on-time point and/or the off-time point of the internal clock signals ICLK of the i memory modules MD1 to MDi may be differently set.

Referring to FIG. 15, since the i memory modules MD1 to MDi may share the global serial data line GSDAL and the global serial clock signal line GSCLL, a total of i global data communications may be sequentially performed to generate the control data de of the i memory modules MD1 to MDi.

However, unlike the configuration shown, the memory system may have a configuration in which the global serial data line GSDAL is commonly connected to the i memory modules MD1 to MDi and i global serial clock signal lines GSCLL is connected to the i memory modules MD1 to MDi, respectively, and one global data communication may be performed to generate the control data de of the i memory modules MD1 to MDi.

As a result, the on-time points and/or the off-time points of the internal clock signals ICLK of the i memory modules MD1 to MDi may be differently set, and thus an operating time points of the voltage regulators 14-18 or 14-18" of the power management units 14 or 14' may be differ from each other. Accordingly, a drop of the external power supply voltage occurring since the operating time points of the voltage regulators 14-18 or 14-18" of the power management units 14 or 14' are the same may not occur. Therefore, the internal power supply voltages may be stably generated.

According to the example embodiments described above, an example in which the module position detector generates the module ID is described, however, there may be an example of not including the module position detector. In this case, the control unit may transmit a corresponding module ID of each of the i memory modules to each of the i memory modules.

According to the example embodiments described above, an example which the module position detector generates the module ID according to the passive element connected to one module position identification terminal MIDP is described, however, the module position detector may generate the module ID by detecting voltages connected to at least two module position identification terminals. For example, when there are 3 module position identification terminals, 8 different module IDs may be generated by detecting at least two voltages (for example, a power supply voltage and a ground voltage) connected to the 3 module position identification terminals.

According to the example embodiments described above, the memory module may stable generate the internal power supply voltages by varying the on-time point and/or the off-time point of the internal clock signal based on the module ID. Further, the memory system having the plurality of memory modules may stably generate the internal power supply voltages by differently controlling the on-time points and/or the off-time points of the internal clock signals of the plurality of power management units included in the plurality of memory modules. Accordingly, reliability of an operation of the memory module and the memory system having the same may be ensured.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

What is claimed is:
1. An operating method of a memory module, comprising:
generating position data related to a corresponding module slot of a main board by a serial presence detector when the memory module is inserted into the corresponding module slot of the main board;
transferring the position data to a power management integrated circuit using serial data and a serial clock signal of the corresponding module slot;
generating a frequency offset code in response to the position data by the power management integrated circuit;
adjusting a switching frequency of an internal clock signal according to the frequency offset code;
operating a first voltage regulator of the power management integrated circuit at a first switching frequency of the internal clock signal; and
operating a second voltage regulator of the power management integrated circuit at a second switching frequency of the internal clock signal,
wherein the first switching frequency and the second switching frequency are different.
2. The method of claim 1, wherein the serial presence detector generates the position data by recognizing a position of the corresponding module slot.
3. The method of claim 2, wherein the corresponding module slot includes a resistor connected to a terminal connected to the serial present detector,
wherein the generating the position data includes:
recognizing a value of the resistor in the serial present detector; and
generating the position data according to the value of the resistor.
4. The method of claim 1, further comprising,
generating an internal voltage in each of the first voltage regulator and the second voltage regulator in response to the internal clock signal.
5. The method of claim 4, wherein the each one of the first voltage regulator and the second voltage regulator is activated in response to the internal clock signal and generates the internal voltage using an external power supply voltage.
6. The method of claim 5, wherein the first voltage regulator and the second voltage regulator generate different internal voltages in response to the internal clock signal.
7. The method of claim 1, wherein the adjusting the switching frequency of the internal clock signal includes:
generating the internal clock signal in an internal clock signal generator of in the power management integrated circuit; and
adjusting the internal clock signal in the internal clock signal generator according to the frequency offset code.
8. The method of claim 1, further comprising, storing the frequency offset code in a register of in the power management integrated circuit.
9. The method of claim 1, wherein the serial present detector transfers the position data to the power management integrated circuit through an I2C/I3C communication.
10. The method of claim 1, wherein the frequency offset code corresponds to an identification number of module slots of the main board.
11. A memory module comprising:
a serial presence detector configured to generate position data related to a corresponding module slot of a main board when the memory module is inserted into the corresponding module slot of the main board;
a power management integrated circuit configured to receive the position data from the serial presence detector, to generate a frequency offset code in response to the position data, to adjust a switch frequency of an internal clock signal according to the frequency offset code, to operate a first voltage regulator at a first switching frequency of the internal clock signal; and
to operate a second voltage regulator at a second switching frequency of the internal clock signal; and
a plurality of memory devices configured to receive at least one internal power from the first voltage regulator and the second voltage regulator and to perform an operation in response to command/address signals,
wherein the first switching frequency and the second switching frequency are different.
12. The memory module of claim 11, further comprising at least one module position identification terminal, wherein the serial presence detector detects a passive element connected to the at least module position and generates the position data.
13. The memory module of claim 11, wherein the power management integrated circuit includes a register configured to store the frequency offset code.
14. The memory module of claim 11, wherein the power management integrated circuit includes an internal clock signal generator configured to generate the internal signal having an on-time point or an off-time point set in response to the frequency offset code corresponding to the position data.
15. The memory module of claim 11, further comprising:
a temperature sensor communicatively coupled to the power management integrated circuit; and a register clock driver communicatively coupled to the power management integrated circuit, wherein the resister clock driver receives and transmits the command/address signals to the plurality of the memory devices.

16. A memory system comprising:

a main board having a plurality of module slots;

a plurality of memory modules mounted in the plurality of module slots, respectively; and a controller configured to control the plurality of memory modules, wherein each of the plurality of memory modules includes a voltage regulator configured to receive an external power supply voltage and to generate an internal power supply in response to an internal clock signal, wherein the each of the plurality of memory modules adjusts a switching frequency of the internal clock signals according to position data related to a corresponding module slot of the main board;

wherein switching frequencies of voltage regulators are not same.

17. The memory system of claim 16, wherein the controller generates the position data, which is transferred to the plurality of memory modules, respectively, and wherein the position data includes a module identification number.

18. The memory system of claim 16, wherein the each of the plurality of memory module detects a voltage or a current of a module position identification terminal and generates the position data according to the detected voltage or the detected current.

19. The memory system of claim 16, wherein the each of plurality of memory modules includes a power management integrated circuit having the voltage regulator, wherein the power management integrated circuit generates a frequency offset code corresponding to the position data and adjust the internal clock signal in response to the frequency offset code.

20. The memory system of claim 16, wherein the each of the plurality of the memory modules includes a serial present detector configured to generate the position data by detecting a passive element when the each of the plurality of memory modules inserted into corresponding module slot of the main board.

* * * * *